(12) United States Patent
Yonekura

(10) Patent No.: US 7,068,989 B2
(45) Date of Patent: Jun. 27, 2006

(54) PHASE LOCK OSCILLATOR AND COMMUNICATION EQUIPMENT

(75) Inventor: Kunitoshi Yonekura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 624 days.

(21) Appl. No.: 09/928,799

(22) Filed: Aug. 13, 2001

(65) Prior Publication Data

US 2002/0127989 A1    Sep. 12, 2002

(30) Foreign Application Priority Data

Mar. 6, 2001    (JP) .............................. 2001-061854

(51) Int. Cl.
*H03L 7/095* (2006.01)

(52) U.S. Cl. .................. 455/260; 455/141; 455/147; 331/179; 375/375; 375/376

(58) Field of Classification Search ................ 331/135, 331/1, 17, 158; 455/76, 86; 370/280; 375/375, 375/376

See application file for complete search history.

(56) References Cited

U.S. PATENT DOCUMENTS

| | | | |
|---|---|---|---|
| 4,543,540 A * | 9/1985 | Linder ...................... 331/1 A |
| 4,627,099 A * | 12/1986 | Shimakata .................... 455/76 |
| 5,225,793 A * | 7/1993 | Higashiyama et al. ....... 331/158 |
| 5,414,741 A * | 5/1995 | Johnson ...................... 375/376 |
| 5,598,405 A * | 1/1997 | Hirose ........................ 370/280 |
| 5,939,947 A * | 8/1999 | Nakao et al. ................. 331/11 |
| 6,314,150 B1 * | 11/2001 | Vowe .......................... 375/374 |
| 6,549,078 B1 * | 4/2003 | Sridharan et al. ............. 331/17 |
| 2001/0038676 A1 * | 11/2001 | Matsumaru et al. ........ 375/376 |
| 2002/0009983 A1 * | 1/2002 | Pritchett et al. ............ 455/260 |
| 2004/0012453 A1 * | 1/2004 | Dally et al. ................. 331/135 |

FOREIGN PATENT DOCUMENTS

JP    08-111659    4/1996

* cited by examiner

*Primary Examiner*—Fan Tsang
*Assistant Examiner*—Lisa Hashem
(74) *Attorney, Agent, or Firm*—Katten Muchin Rosenman LLP

(57) ABSTRACT

The present invention relates to a phase lock oscillator which has a phase-locked loop including a reactive element and varies a reactance of the reactive element at an instant prior to an instant at which the phase-locked loop reaches a limit of maintaining its lock state, and relates to a communication equipment with the lock phase oscillator mounted therein. The phase lock oscillator and the communication equipment can flexibly adapt to variances in environment conditions and maintain stable and high service quality.

17 Claims, 13 Drawing Sheets

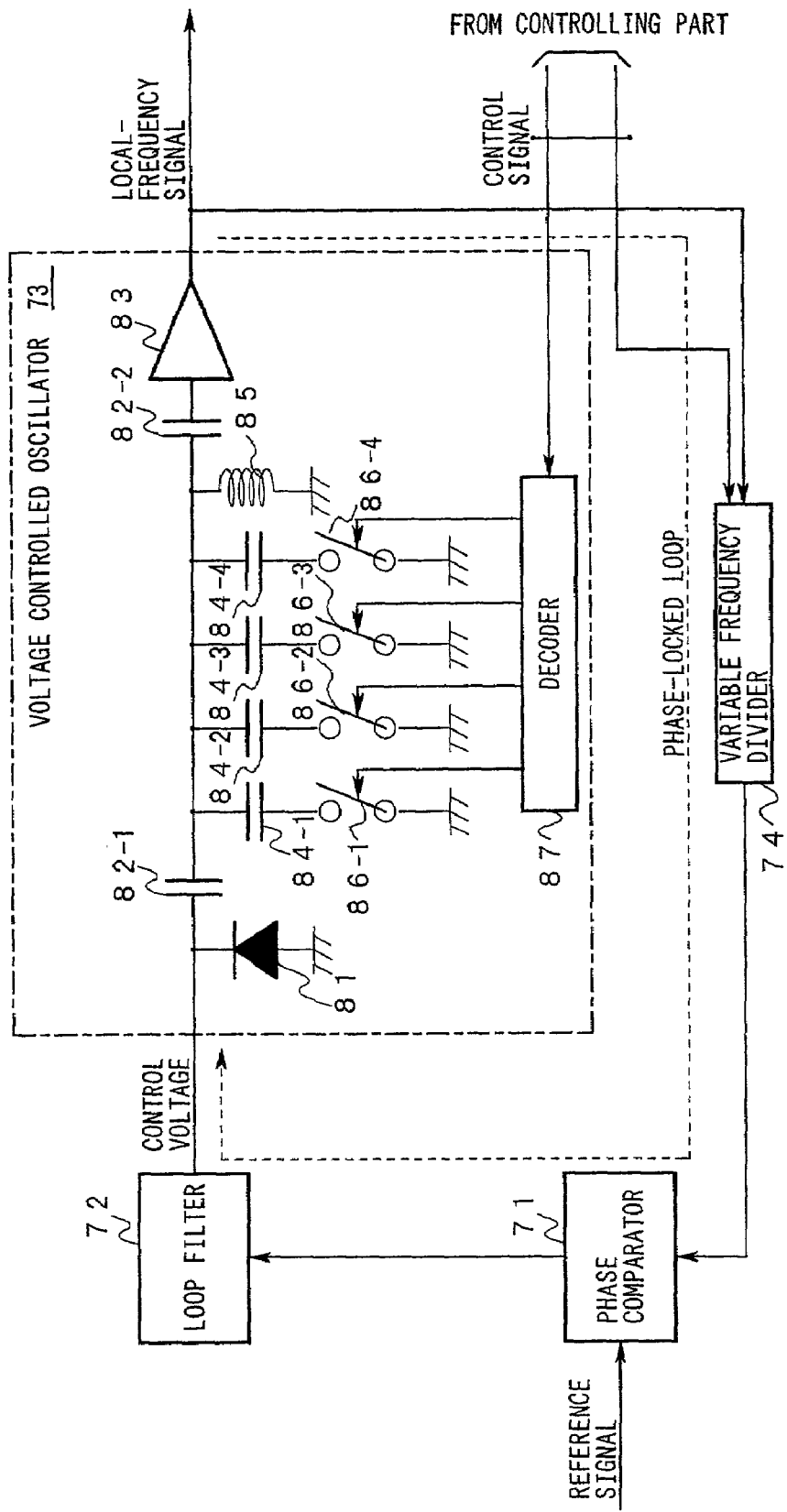
PRIOR ART FIG. 11

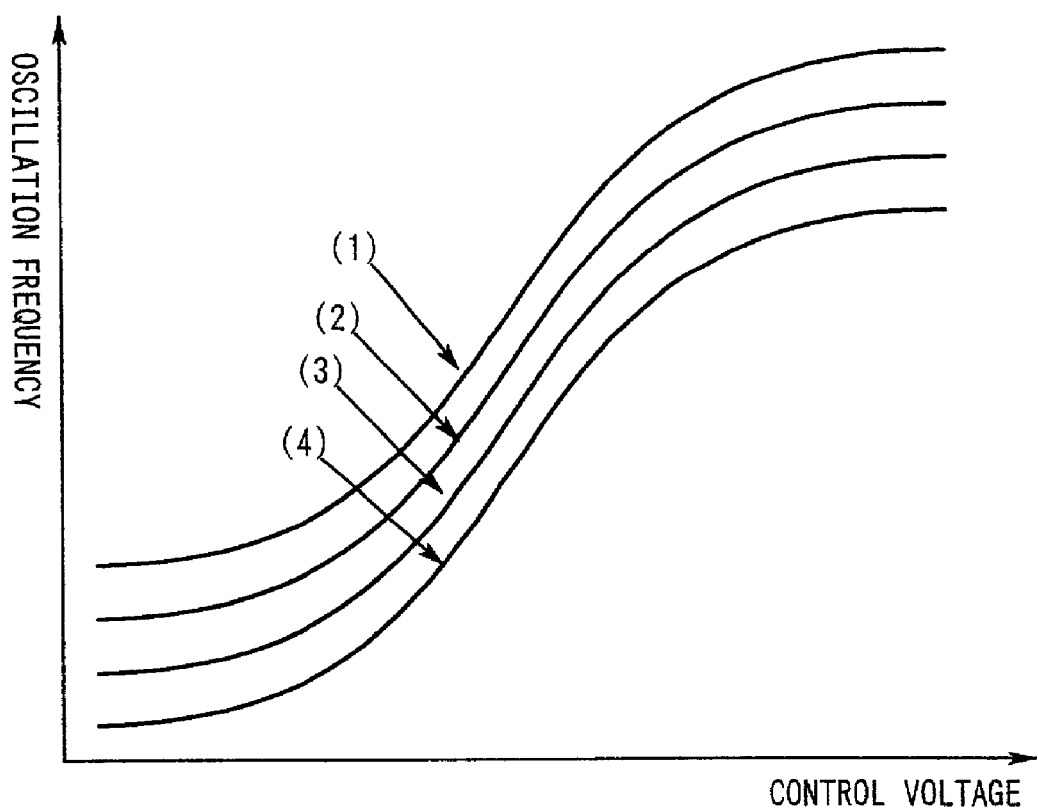
PRIOR ART FIG. 12

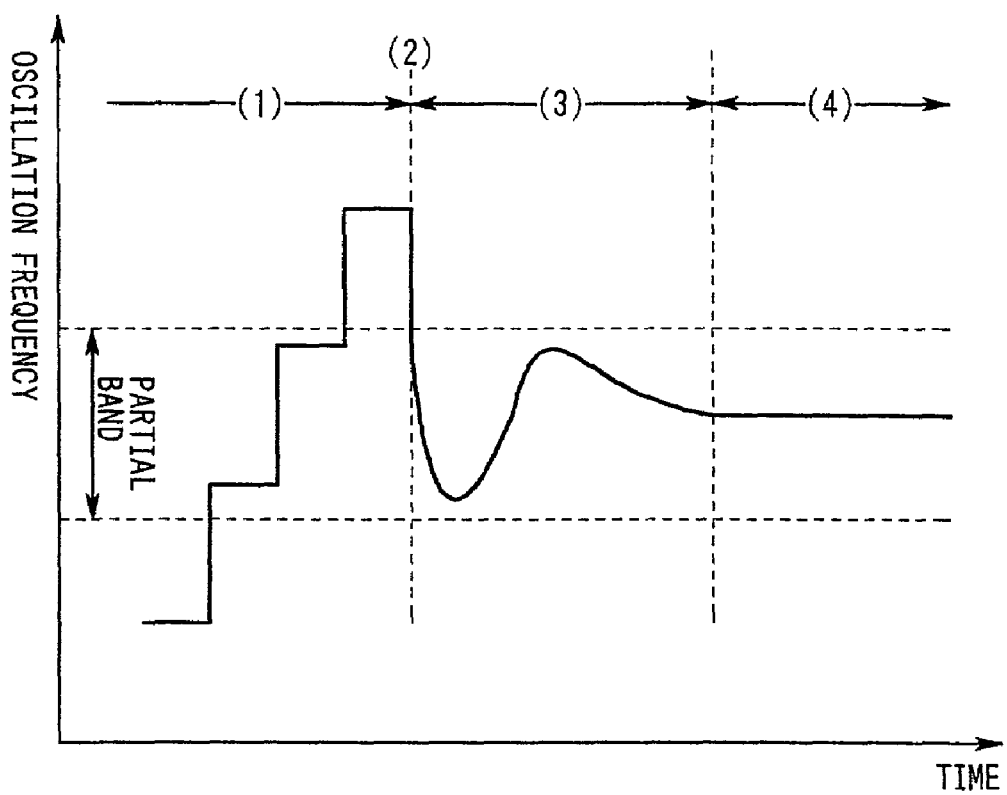
PRIOR ART FIG. 13

PHASE LOCK OSCILLATOR AND COMMUNICATION EQUIPMENT

BACKGROUND OF THE INVENTION

1. Field of the Invention

The present invention relates to a phase lock oscillator comprising a voltage controlled oscillator whose oscillation frequency changes according to a control voltage and a communication equipment with the phase lock oscillator mounted therein.

2. Description of the Related Art

There have been seriously demanded downsizing, lightening, and reduction in power consumption for terminal equipment of a portable type which can provide a communication service to subscribers of a mobile communication system, so that the terminal equipment incorporates a frequency synthesizer which can realize a smooth access to a desired radio channel in a process of channel control performed in cooperation with a radio base station.

FIG. 11 is a diagram showing a structural example of a conventional frequency synthesizer.

In the drawing, a first input of a phase comparator 71 is given a reference signal with a known frequency and an output of the phase comparator 71 is connected to one input of a voltage controlled oscillator (VCO) 73 via a loop filter 72. An output of the voltage controlled oscillator 73 is connected to an input of a circuit (not shown) to which a local-frequency signal generated by the voltage controlled oscillator 73 is to be given and an input of a variable frequency divider 74. An output of the variable frequency divider 74 is connected to a second input of the phase comparator 71. Another input of the voltage controlled oscillator 73, a third input of the phase comparator 71, and a control input of the variable frequency divider 74 are given control signals by a controlling part which is not shown.

The voltage controlled oscillator 73 is composed of the following components:

a variable-capacitance diode 81 in which a cathode is directly connected to an output of the loop filter 72 and an anode is grounded;

capacitors 82-1, 82-2 which are connected in cascade to the output of the loop filter 72, and a negative resistor 83 (supposed to be composed of an amplifier and so on which satisfy an oscillating condition of the voltage controlled oscillator 73 in order to simplify the explanation here);

capacitors 84-1 to 84-4 with one-side ends thereof directly connected to connecting points of capacitors 82-1, 82-2;

an inductor 85 with one end thereof directly connected to a connecting point of the capacitors 82-1, 82-2 and another end grounded;

switches 86-1 to 86-4 with one-side contacts thereof directly and individually connected to other ends of the capacitors 84-1 to 84-4 and other contacts grounded; and a decoder 87 in which an input thereof is given the control signal and which has four output terminals directly and individually connected to control terminals of the switches 86-1 to 86-4.

In the frequency synthesizer as structured above, either one of the switches 86-1 to 86-4 provided in the voltage controlled oscillator 73 is set to on-position in response to a command which is given by the decoder 87 in response to values of the control signal (supposed to be either one of four values corresponding to the switches 86-1 to 86-4 respectively in order to simplify the explanation here).

As shown in FIG. 12 (1) to (4), the voltage controlled oscillator 73 generates a local-frequency signal with an oscillation frequency f which corresponds to a combination of capacitance of the capacitors whose other ends are grounded via the switches set to on-position, out of the capacitors 84-1 to 84-4, and a capacitance of the variable-capacitance diode 81 which increases/decreases according to a control voltage given by the loop filter 72.

Meanwhile, the controlling part forcibly initializes a state of a phase-locked loop from the output of the voltage controlled oscillator 73 to the input of the voltage controlled oscillator 73 via the variable frequency divider 74, the phase comparator 71, and the loop filter 72 at the start to set an instantaneous value of the control voltage mentioned above at an initial value (supposed to correspond to a mid-point of a variable range of the control voltage in order to simplify the explanation here). Incidentally, the controlling part gives a predetermined constant appropriate for a prescribed frequency, which is described later, to the variable frequency divider 74 as a division ratio.

The controlling part also varies values of the above-described control signals step by step at a predetermined cycle to compare a frequency of the local-frequency signal generated by the voltage controlled oscillator 73 according to these values and the control voltage (=the initial value) with the prescribed frequency and specifies a value (hereinafter called a 'rough tuning value'), out of these values, at which the local-frequency signal with the prescribed frequency can be generated within the variable range of the control voltage (FIG. 13 (1)).

Furthermore, the controlling part maintains the value of the control signal at this rough tuning value and releases the initialization of the phase-locked loop described above (FIG. 13 (2)).

Therefore, even when a band of the local-frequency signal to be generated by the voltage controlled oscillator 73 is broad, the phase-locked loop can shift to a lock state (FIG. 13 (3), (4)) as long as a frequency of the local-frequency signal substantially corresponds to a middle of a partial band corresponding to the 'rough tuning value', out of a plurality of partial bands which divide the band.

Note that the process in which the phase-locked loop shifts to the lock state in this way is called simply a 'self-tuning' hereinafter.

In the conventional example described above, the variable range of the capacitance of the variable-capacitance diode 81 is neither always set at a value large enough to vary the frequency of the local-frequency signal over a prescribed broad band without changing the value of the control signal, nor is a quality factor Q of the inductor 85 at a sufficiently large value.

Therefore, it has been difficult to realize a frequency synthesizer with a broad band unless a control system in which the complication of a hardware structure thereof is tolerated and the partial bands can be switched at a high rate is applied thereto.

However, in general, it is difficult to apply such a structure to terminal equipment of a portable type in which cost reduction, downsizing, and lightening are severely demanded as well as reduction in power consumption.

Furthermore, in recent years, the integration of a radio part which is to be mounted in terminal equipment of a portable type is strongly demanded with the aim of realizing the above demands, and as a result, the variable range of the capacitance of the variable-capacitance diode 81 and a feasible value of the quality factor Q of the inductor 85 are actually limited to small values as well.

Therefore, the lock state mentioned above is not always maintained when temperature, a power-supply voltage, and other environment conditions change, which may possibly lower service quality and transmission quality since the maintenance of a radio transmission channel is prevented.

This degeneration of service quality and transmission quality can be prevented when the self-tuning is automatically retried at a predetermined frequency in a channel control process.

However, in most mobile communication systems to which a multiple access system other than a TDMA system is applied, a terminal in which a call (including a call realizing a hand off occurs, has to continuously transmit/receive some information to/from a base station unless the call is extinct.

Consequently, it has been difficult to actually employ the configuration in which the self-tuning is repeatedly retried at a predetermined frequency.

SUMMARY OF THE INVENTION

It is an object of the present invention to provide: a phase lock oscillator which is suitable for integration and has a wide capture range and a lock range in order to flexibly adapt to variances in environmental condition; and a communication equipment in which transmission quality and service quality are highly maintained with stability by incorporating a frequency synthesizer.

It is another object of the present invention to greatly reduce limitations to achieving integration of an equipment which can realize cost reduction, downsizing, and reduction in power consumption, and to improve service quality and reliability without any basic changes in configuration, in a transmission system to which the invention is applied.

It is still another object of the present invention to broaden the bands of the capture range and the lock range even when the lock range may possibly fluctuate due to a change in environmental conditions and so on.

It is yet another object of the present invention to surely decrease or avoid a transmission delay due to the phase lock oscillator unable to transmit during a lock-up period, even when there is a high possibility that the phase lock oscillator is not able to maintain its lock state owing to variances in environmental conditions and so on.

It is yet another object of the present invention to maintain high and stable transmission quality.

It is yet another object of the present invention to surely decrease or avoid a transmission delay which is caused by a receiving part unable to receive a reception signal during a period in which the phase lock oscillator retries the lock-up, even when there is a high possibility that the phase lock oscillator cannot maintain the lock state due to variances in environmental conditions and so on.

It is yet another object of the present invention to flexibly apply the phase lock oscillator to transmission systems according to various transmission schemes and in various configurations.

It is yet another object of the present invention to improve and stably maintain transmission quality.

It is yet another object of the present invention to surely decrease or suppress variances in transmission delay time and transmission quality.

It is yet another object of the present invention to flexibly apply the phase lock oscillator to various transmission systems without changing the procedure of communication control such as channel control.

The above objects are realized by a phase lock oscillator which varies a reactance of a reactive element at an instant prior to an instant which is a limit in a phase-locked loop including a reactive element and being capable of maintaining its lock state.

In the phase lock oscillator as described above, the lock-up of the phase-locked loop is automatically retried prior to the limit instant.

The above objects are also realized by a phase lock oscillator which has a voltage controlled oscillator including a resonator and varies a resonance frequency of the resonator when a control voltage given to the voltage controlled oscillator reaches a predetermined value.

In the above phase lock oscillator the phase-locked loop retries the lock-up according to the variance in resonance frequency since the limit to which the phase-locked loop is capable of maintaining the lock state is detected in advance by monitoring the control voltage.

The above objects are also realized by a communication equipment which: generates a signal with a desired frequency based on an indirect frequency synthesis; retries the lock-up before the phase-locked loop for realizing the frequency synthesis reaches the limit in maintaining its lock state; and performs transmission in a compress mode during a period prior to and/or a period succeeding a period where the retrial is performed, so that a transmission delay is decreased or avoided.

In the communication equipment as described above, a transmission rate applied for transmission in a specified period including a period prior to and/or a period succeeding a period in which the phase-locked loop performs the lock-up, is set to a value higher than transmission rates applied in other periods.

The above objects are also realized by a communication equipment which controls its transmitting part to transmit a signal which notifies an opponent communication equipment of a change in transmission rate before the start of transmitting transmission information at the higher transmission rate.

In the above communication equipment, the opponent communication equipment is able to make a precise preparation required for receiving the transmission information transmitted at the aforesaid high transmission rate from the transmitting part, in response to the notification.

The above objects are also realized by a communication equipment which performs reception in the compress mode during the prior period and/or the succeeding period.

In the communication equipment as described above, a transmission delay which is caused by the receiving part unable to receive the reception signal during the period where the lock-up is retried, is reliably decreased or avoided even when the phase-locked loop can not maintain its lock state due to variances in environmental conditions and so on.

The above objects are also realized by a communication equipment which transmits a notification indicating of discriminating in advance an instant which is a limit in maintaining the lock state, before the start of retrying the lock-up.

In the above communication equipment, the receiving end and a node which receive the signal can reliably make a preparation required for receiving the transmission information transmitted at the aforesaid high transmission rate from the transmitting part, in response to the notification.

The above objects are also realized by a communication equipment, wherein the notification includes information indicating a change in transmission rate.

In the communication equipment as described above, the opponent communication equipment receiving the notification is able to reliably make a preparation required for receiving the transmission information transmitted at the aforesaid high transmission rate from the transmitting part, in response to the notification.

The above objects are also realized by a communication equipment, wherein transmitting power in the compress mode is set at a larger value than normal transmitting power.

In the communication equipment as described above, the transmission information transmitted at the aforesaid high transmission rate is stably transferred in good transmission quality to the receiving end.

The above objects are also realized by a communication equipment which varies the reactance of the reactive element until an instant at which a reception of a response transmitted from the receiving end which receives the notification is completed.

In the communication equipment as described above, it is possible to reliably discriminate a period in which the lock-up is to be retried, and starting/terminal points of a specified period in which a transmission rate is to be changed, through cooperation between the communication equipment in the present invention and a receiving end connected via a transmission channel, responding to the notification and the response.

The above objects are also realized by a communication equipment, wherein a lock-up time t of the phase lock oscillator is equal to or shorter than a product of: a difference between a ratio r of maximum to minimum values of a transmission rate applicable to both or one of transmitting/receiving, and '1'; and a length T of a period which is within a specified period and where the transmission rate is set higher than the minimum value, the specified period starts at an instant succeeding an instant discriminated prior to the instant which is a limit in maintaining the lock state, and does not correspond to the period where lock-up is retried.

In the communication equipment as described above, even when there are some limitations to possible values of the ratio r and the length T of a period, variances in transmission delay time and transmission quality are reliably decreased and suppressed.

The above objects are also realized by a communication equipment, wherein the ratio r is set to a value equal to or higher than a sum of a ratio of a lock-up time t to a length T of a period, and '1'.

In the communication equipment as described above, even when there are some limitations to possible values of the lock-up time t and the length T of a period, variances in transmission delay time and transmission quality are surely decreased or suppressed The above objects are also realized by a communication equipment, wherein a length T of a period is set to a value equal to or longer than a ratio of a lock-up time t to a difference between a ratio r and '1'.

In the communication equipment as described above, variances in transmission delay time and transmission quality are surely decreased or suppressed even when there are some limitations to possible values of the lock-up time t and the ratio r.

The above objects are also realized by a communication equipment, wherein transmission information is transmitted/received via a sequence of multiplexed slots, and a transmission rate is set individually for each slot.

In the communication equipment as described above, the invention is applied as a communication control over a physical layer for realizing the transmission via a sequence of multiplexed slots, or over the physical layer and a logical layer closet to the physical layer.

The above objects are also realized by a communication equipment, wherein a signal generated by the phase lock oscillator is applied as a local-frequency signal for realizing frequency conversion.

In the communication equipment as described above, the signal generated by the phase lock oscillator is used for the above transmission/reception without being directly modulated or demodulated.

BRIEF DESCRIPTION OF THE DRAWINGS

The nature, principle, and utility of the invention will become more apparent from the following detailed description when read in conjunction with the accompanying drawings in which like parts are designated by identical reference numbers, in which:

FIG. 11 is a diagram showing a structural example of a conventional frequency synthesizer;

FIG. 12 is a chart showing voltage-frequency conversion characteristics of a voltage controlled oscillator; and FIG. 13 is a chart showing an oscillation frequency of the voltage controlled oscillator in a lock-up process.

DESCRIPTION OF THE PREFERRED EMBODIMENTS

A principle of a phase lock oscillator according to the present invention is first explained with reference to FIG. 1.

Figure 1:
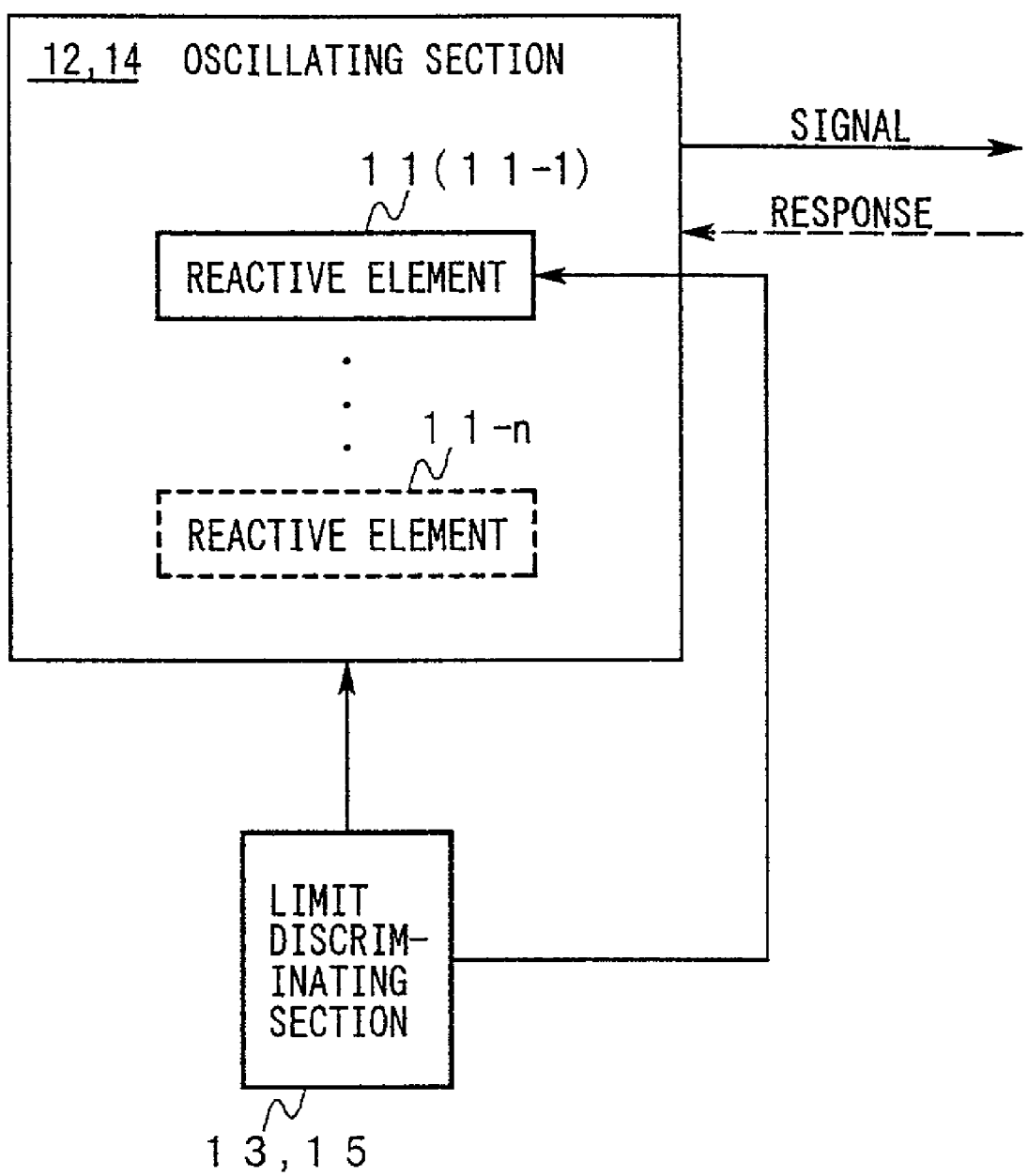
FIG. 1 is a block diagram showing a principle of a first phase lock oscillator according to the present invention.

FIG. 1 is a diagram showing a principle of a first phase lock oscillator according to the present invention.

The phase lock oscillator shown in FIG. 1 is composed of reactive elements 11 (11-1) to 11-n, oscillating sections 12, 14 including the reactive elements 11(11-1)to 11-n, and limit discriminating sections 13, 15.

The principle of the first phase lock oscillator according to the present invention is described as follows.

The oscillating section 12 has a phase-locked loop including the reactive element 11 and generates a signal with a predetermined frequency. The limit discriminating section 13 varies a reactance of the reactive element 11 when discriminating an instant prior to an instant which is a limit in the phase-locked loop being capable of maintaining its lock state. The oscillating section 12 also retries to lock up the phase-locked loop when the prior instant mentioned above is discriminated.

In the phase lock oscillator as structured above, the lock-up of the phase-locked loop is automatically retried prior to the above-mentioned limit instant.

Therefore, even when a lock range obtained according to a value of the reactance is not always sufficiently wide and the lock range may possibly fluctuate due to changes in environment conditions and so on, the bands of a capture range and the lock range can be broadened as long as the reactance of the reactive element 11 is set at a proper value.

Figure 2:
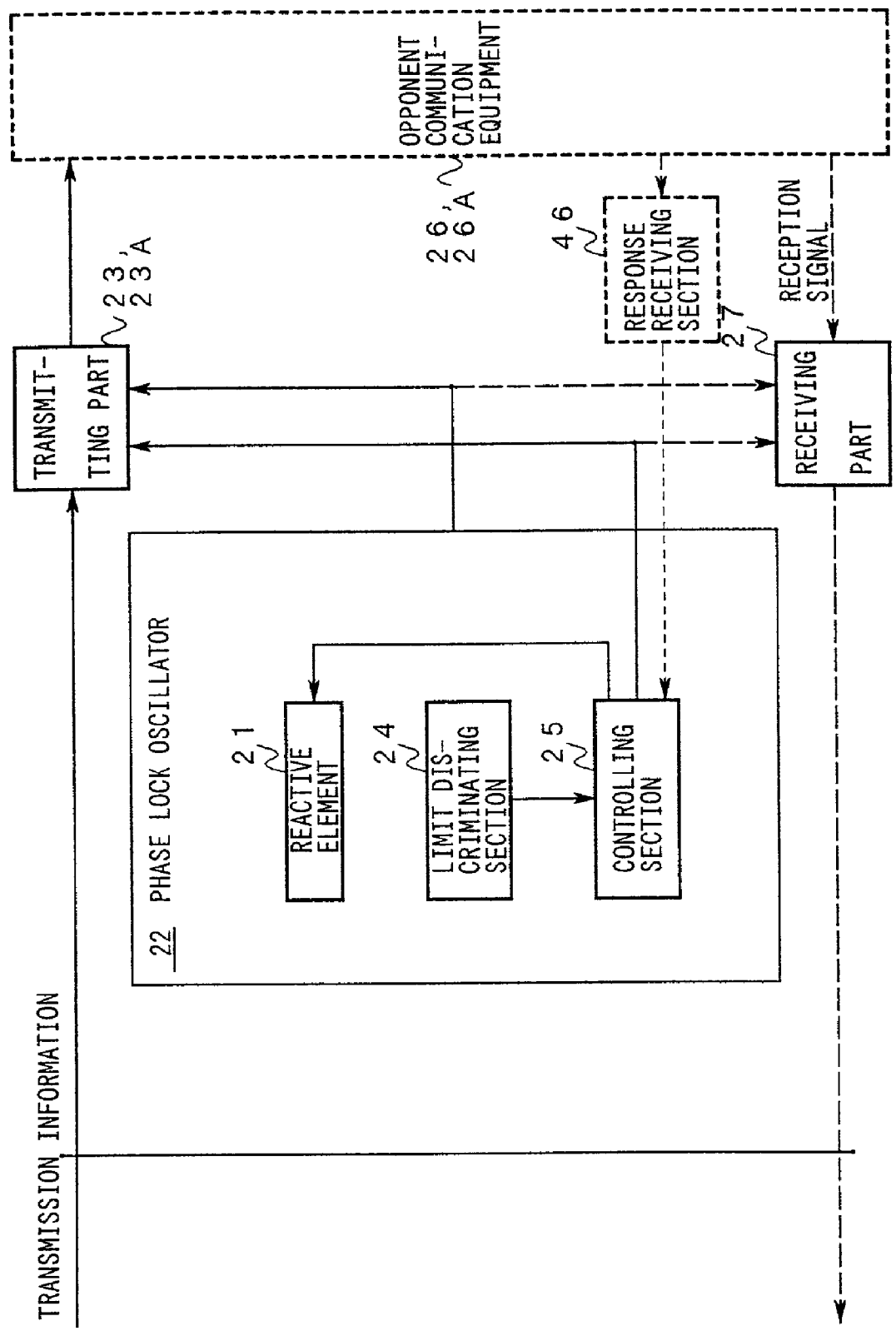
FIG. 2 is a block diagram showing a principle of communication equipment according to the present invention.

FIG. 2 is a block diagram showing a principle of a communication equipment according to the present invention.

The communication equipment shown in FIG. 2 is composed of a phase lock oscillator 22 which includes a reactive element 21, a limit discriminating section 24, and a controlling part 25, and transmitting parts 23, 23A, a receiving part 27, and a response receiving section 46.

A principle of a first communication equipment according to the present invention is explained below.

The limit discriminating section 24 monitors a phase-locked loop of the phase lock oscillator 22 and discriminates an instant prior to an instant which is a limit in the phase-locked loop being capable of maintaining its lock state. When the prior instant is detected, the controlling part 25 starts a processing of varying a reactance of the reactive element 21 at a first instant succeeding the prior instant. Furthermore, the controlling part 25 controls a transmitting part 23 to transmit transmission information at a higher transmission rate than a transmission rate applied immediately before the prior instant during a specified period from an instant at which the prior instant is detected, to an instant before the first instant, or after a predetermined time elapses from the first instant.

In the communication equipment as structured above, a transmission rate applied to transmission in the above specified period is set to a value higher than transmission rates in other periods. The specified period is one or both of a period prior to and a period succeeding a period in which the phase lock oscillator 22 performs lock-up.

Therefore, a transmission delay which is caused by the transmitting part 23 unable to transmit during a period in which the phase lock oscillator retries the lock-up is surely decreased or avoided even when there is a high possibility that the phase lock oscillator 22 is not capable of maintaining the lock state due to variances in environment conditions and so on.

A principle of a second communication equipment according to the present invention is explained below.

The controlling part 25 controls the transmitting part 23 to transmit a signal for notifying an opponent communication equipment 26 of a change in transmission rate before a beginning of transmitting transmission information at the higher transmission rate mentioned above.

In the communication equipment as structured above, a receiving end and a node which receive the above signal can make, in response to the notification, a highly precise preparation required for receiving the transmission information which is to be transmitted at the aforesaid high transmission rate from the transmitting part 23.

Consequently, transmission quality is highly maintained with stability, compared with a case in which an instant where the preparation is made is discriminated asynchronously with an operation of the transmitting part 23.

A principle of a third communication equipment according to the present invention is explained below.

The limit discriminating section 24 monitors the phase-locked loop of the phase lock oscillator 22 and discriminates an instant prior to an instant which is a limit in the phase-locked loop being capable of maintaining the lock state. When the prior instant is detected, the controlling part 25 starts the processing of varying the reactance of the reactive element 21 at the first instant succeeding the prior instant. Furthermore, the controlling part 25 controls the receiving part 27 to process receipt of the reception signal at a higher transmission rate than the transmission rate applied immediately before the prior instant, during a period from the instant at which the prior instant is detected to an instant before the first instant, or after a predetermined length of time elapses from the first instant.

In the communication equipment as structured above, a transmission delay which is caused by the receiving part 27 unable to receive the transmission information during the period of retrying the lock-up by the phase lock oscillator 22 is surely decreased or avoided, even when there is a high possibility that the phase lock oscillator 22 cannot maintain the lock state due to variances in environment conditions.

A principle of a fourth communication equipment is explained below.

The transmitting part 23A transmits the transmission information with the use of an output signal of the phase lock oscillator 22. The controlling part 25 controls the transmitting part 23A to transmit a signal for notifying an opponent communication equipment 26A of the change in transmission rate during the period from the instant at which the prior instant is detected, to the instant before the first instant.

In the communication equipment as structured above, the opponent communication equipment 26A receiving the signal is capable of making a highly precise preparation required for receiving the transmission information, which is to be transmitted at the aforesaid higher transmission rate from the transmitting part 23A, according to the notification.

Consequently, transmission quality is highly maintained with stability, compared with a case in which an instant where the preparation is made is discriminated asynchronously with an operation of the transmitting part 23A.

A principle of a fifth communication equipment according to the present invention is explained below.

When transmitting transmission information at the higher transmission rate, the transmitting part 23 transmits it at a larger power than that when transmitting it immediately before the prior instant.

In the communication equipment as structured above, the transmission information transmitted at the aforesaid higher transmission rate is stably transmitted in good transmission quality to a receiving end.

Consequently, the present invention is flexibly applicable to transmission systems according to various transmission schemes and in various configurations.

A principle of a sixth communication equipment according to the present invention is explained below.

The response receiving section 46 receives a response transmitted from a receiving end which receives a notification transmitted from the transmitting part 23. The response is transmitted in response to the notification. The controlling part 25 withholds the processing of varying the reactance of the reactive element 21 until an instant at which the response receiving section 46 receives the response.

In the communication equipment as structured above, starting/terminal points of a period in which the lock-up is to be retried and the specified period in which the transmission rate is to be changed are reliably discriminated, by the communication equipment according to the invention cooperating with the receiving end connected thereto via a transmission channel in response to the notification.

Consequently, transmission quality is enhanced and stably maintained.

A principle of a seventh communication equipment according to the present invention is explained below.

The phase lock oscillator 22 has a lock-up time t which is equal to or less than a product of: a difference between a maximum–minimum value ratio r of a transmission rate applicable to both or one of transmitting receiving, and '1'; and a length T of a period which is included in the specified period and in which a transmission rate is set to a value higher than the minimum value.

In the communication equipment as structured above, even when there are some limitations to possible values of the ratio r and the length T of the period, variances in a transmission delay time and transmission quality are surely decreased or suppressed as long as the lock-up time t of the phase lock oscillator 22 is set at the aforesaid value.

A principle of an eighth communication equipment according to the present invention is explained below.

The maximum-minimum value ratio r of the transmission rate applicable to both and one of transmitting and receiving is set at a value equal to or larger than a sum of a ratio and '1', the ratio being of a lock-up time t of the phase lock oscillator 22 to a length T of a period which is included in the specified period and in which the transmission rate is set to a value higher than the minimum value.

In the communication equipment as structured above, even when there are some limitations to possible values of the ratio r and the length T of the period, variances in a transmission delay time and transmission quality are surely decreased or suppressed as long as the ratio r is set at the aforesaid value.

A principle of a ninth communication equipment is explained below.

A length T of a period which is included in the specified period and in which the transmission rate to be applied to transmission and/or reception is set to a value higher than the minimum value of the transmission rate thereof, is set at a value equal to or larger than a ratio of a lock-up time t of the phase lock oscillator 22 to a difference between a ratio r and '1', the ratio r being a maximum–minimum value ratio of the transmission rate applied to transmitting and/or receiving.

In the communication equipment as structured above, even when there are some limitations to possible values of the lock-up time t and the ratio r, variances in transmission delay time and transmission quality are surely decreased or suppressed as long as the length T of the period is set at the aforesaid value.

A principle of a tenth communication equipment according to the present invention is explained below.

Transmission information is transmitted/received via a sequence of multiplexed slots. A transmission rate is set individually for each slot.

In the communication equipment as structured above, the invention is applied as a communication control over a physical layer for realizing the transmission via a sequence of multiplexed slots, or over the physical layer and a logical layer closet to the physical layer.

Consequently, the present invention is flexibly applicable to various transmission systems without any change in procedures for communication control such as channel control.

A principle of an eleventh communication equipment is explained below.

A signal generated by the phase lock oscillator 22 is used as a carrier signal employed for transmission or a local-frequency signal employed for generation of the carrier signal.

In the communication equipment as structured above, the signal generated by the phase lock oscillator 22 is used for the above transmission without being directly modulated.

A principle of a twelfth communication equipment according to the present invention is explained below.

The signal generated by the phase lock oscillator 22 is used as a local-frequency signal applied to heterodyne detection in a receiving process.

In the communication equipment as structured above, the signal generated by the phase lock oscillator 22 is used for the above reception without being directly demodulated.

Figure 3:
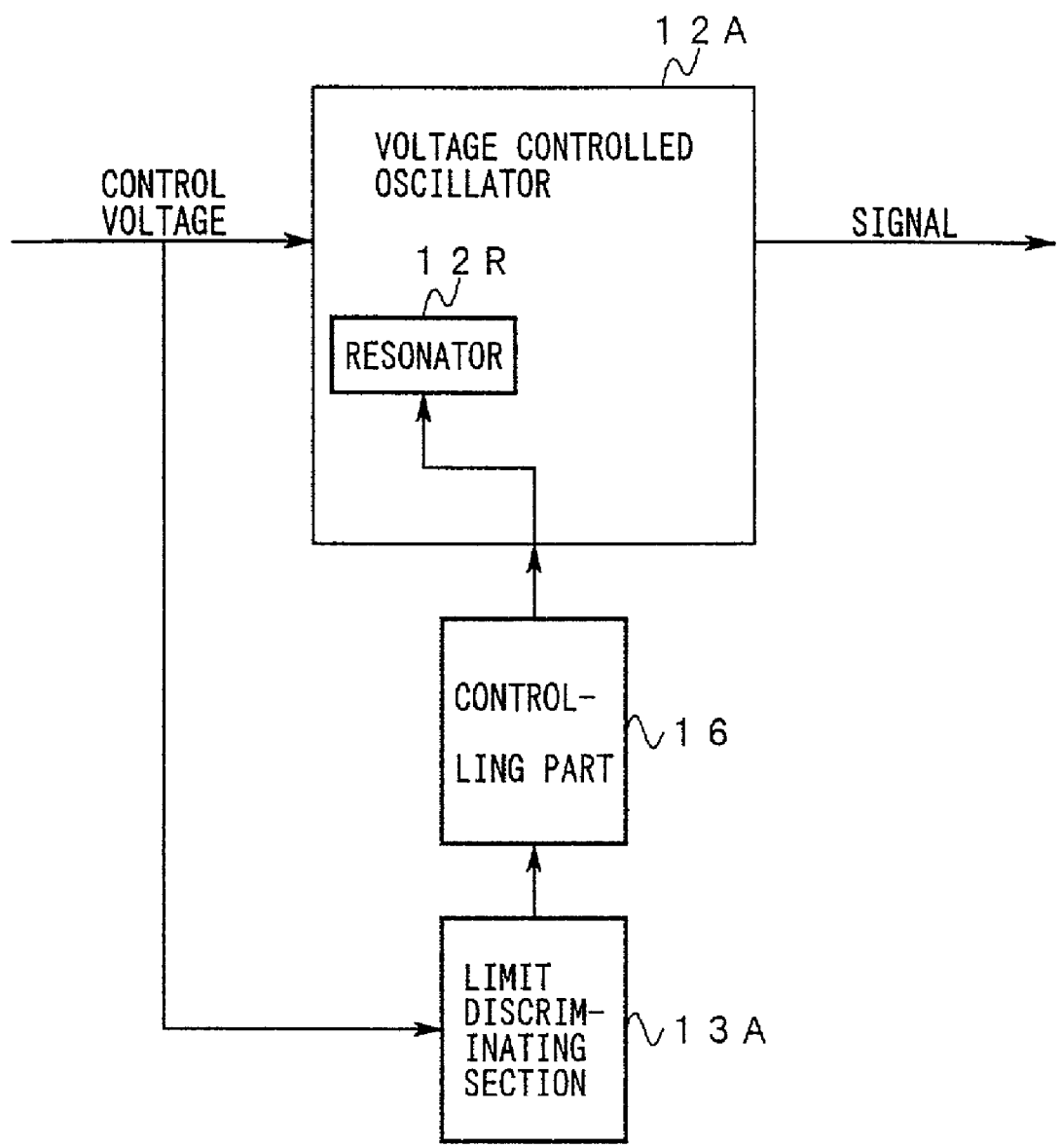
FIG. 3 is a block diagram showing a principle of a second phase lock oscillator according to the present invention.

FIG. 3 is a block diagram showing a principle of a second phase lock oscillator according to the present invention.

The phase lock oscillator shown in FIG. 3 is composed of a voltage controlled oscillator 12A including a resonator 12R, a limit discriminating section 13A, and a controlling part 16.

The principle of the second phase lock oscillator according to the present invention is explained below.

The limit discriminating section 13A detects that a control voltage reaches a predetermined value. At the time of the detection, the controlling part 16 varies a resonance frequency of the resonator 12R.

In the phase lock oscillator as structured above, an instant which is a limit in the phase-locked loop being capable of maintaining its lock state is detected in advance while the control voltage is monitored, so that the phase-locked loop retries the lock-up in response to the aforesaid change in the resonance frequency.

Therefore, even when the lock range of the phase-locked loop is not always sufficiently wide and the lock range may possibly fluctuate due to changes in environment conditions and so on, it is possible to broaden the bands of the capture range and the lock range as long as the resonance frequency is set at a proper value.

Embodiments of the present invention are detailed below with reference to the drawings.

Figure 4:
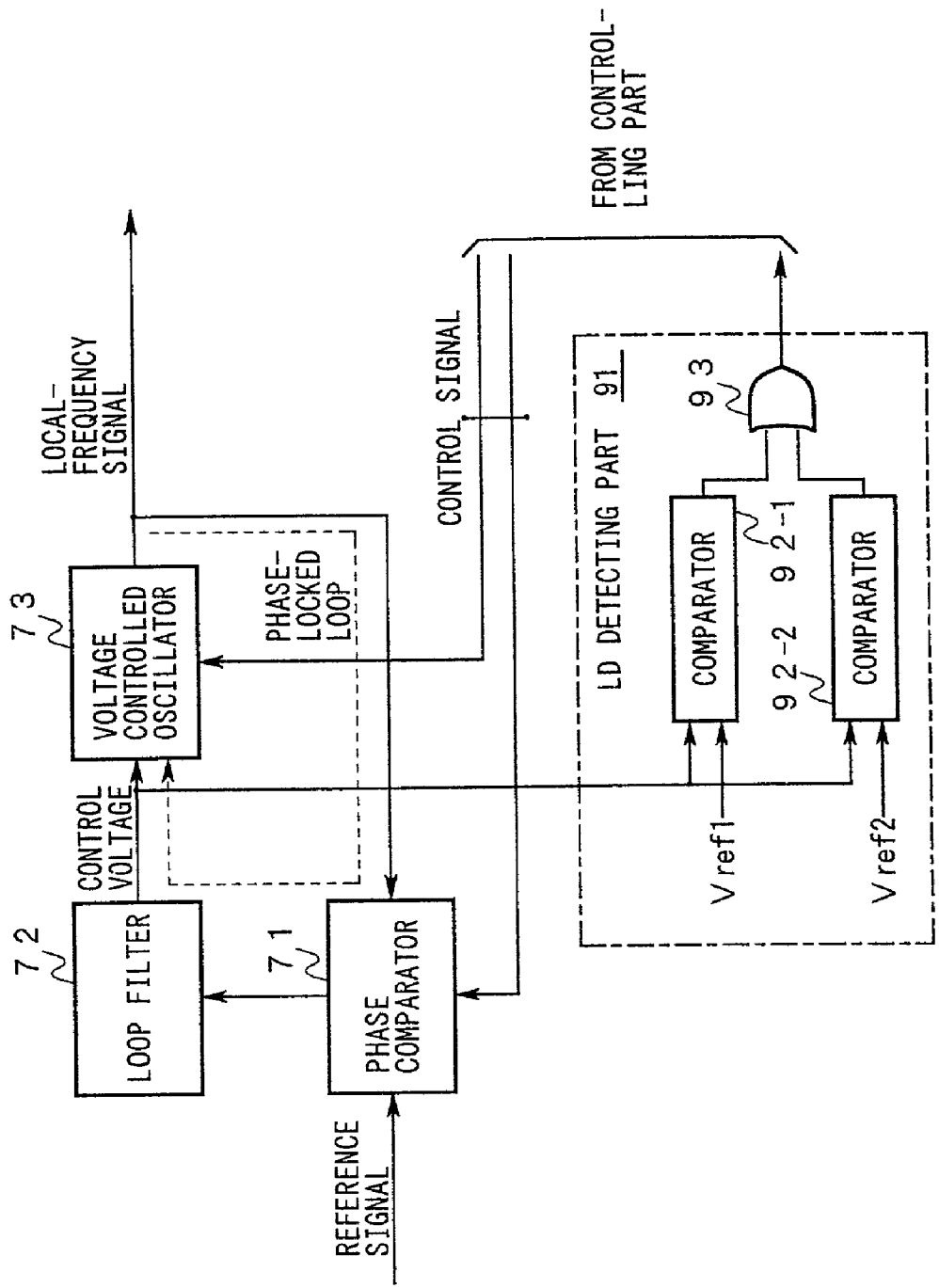
FIG. 4 is a diagram showing a first embodiment of the present invention.

FIG. 4 is a diagram showing a first embodiment of the present invention.

In the drawing, the same symbols and numerals are used to designate the same components as those in FIG. 11 and the explanation thereof is omitted here.

A main different point of this invention from a conventional example shown in FIG. 11 is that an output of a loop filter 72 is connected to a corresponding input of a controlling part via an LD detecting part 91.

The LD detecting part 91 is composed of the following components:

a comparator 92-1 where one input thereof is given a reference voltage Vref1 and another input thereof is connected to the output of the loop filter 72;

a comparator 92-2 where one input thereof is given a reference voltage Vref2 and another input is connected to the output of the loop filter 72; and an OR gate 93 having two inputs individually connected to outputs of the comparators 92-1, 92-2 and being disposed as a final stage of the LD detecting part 91.

Figure 5:
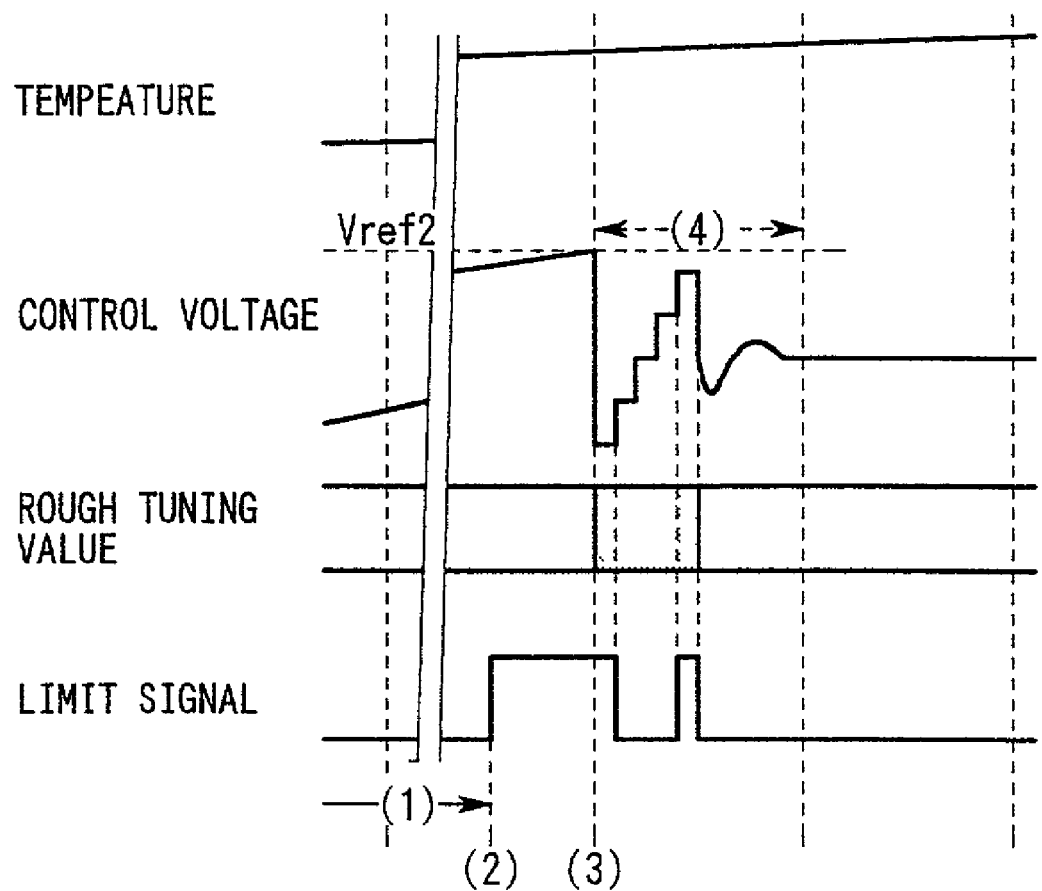
FIG. 5 is a time chart showing an operation in the first embodiment of the present invention.

FIG. 5 is a time chart showing an operation in the first embodiment of the present invention.

Figure 6:
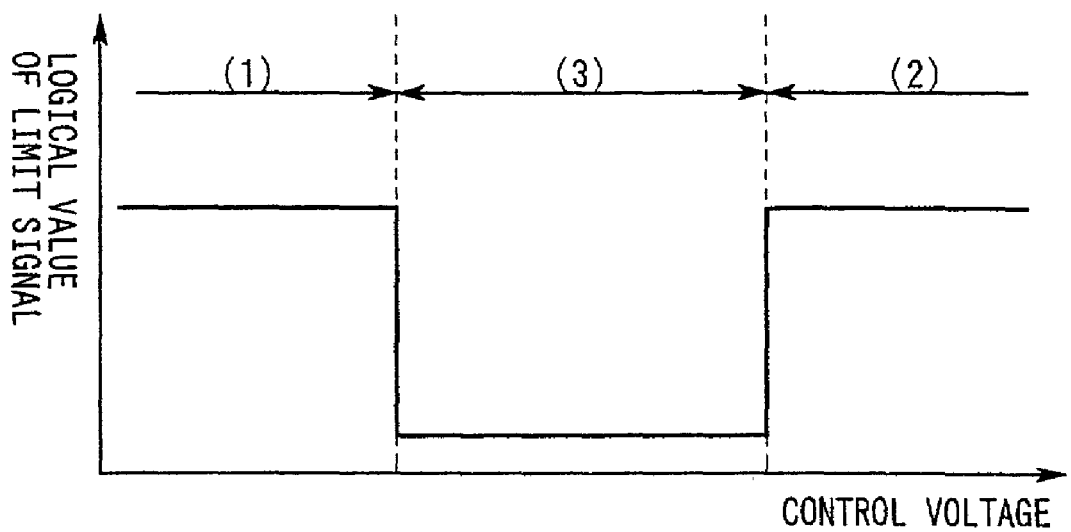
FIG. 6 is an explanatory chart explaining an operation of an LD detecting part according to the first embodiment of the present invention.
Figure 6:
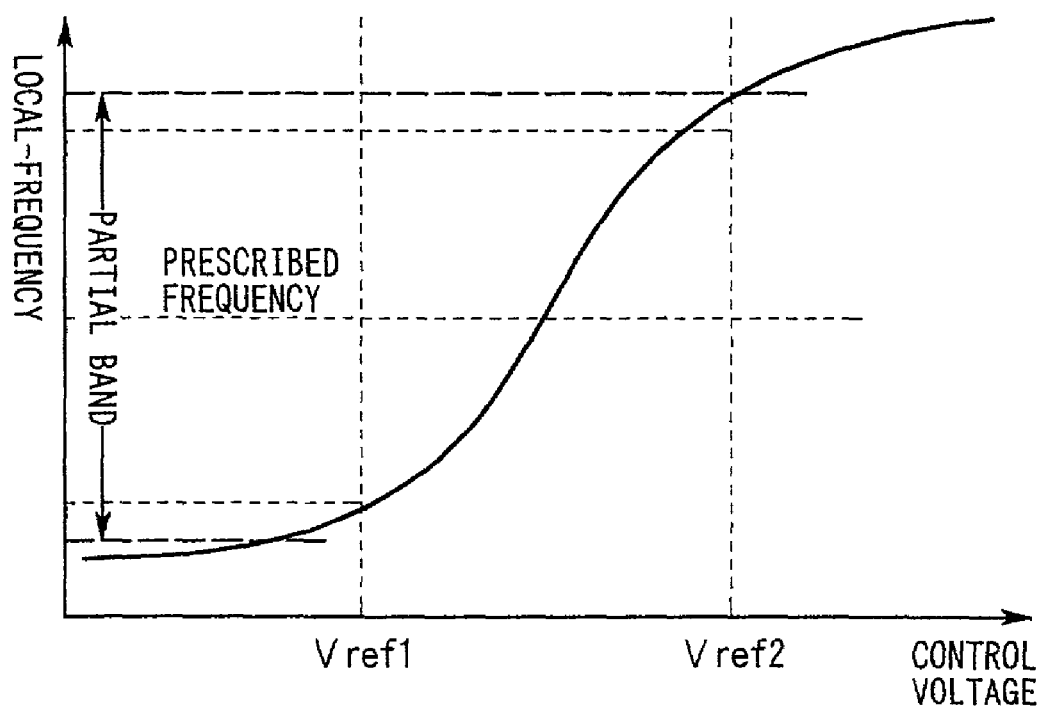

FIG. 6 is an explanatory chart explaining an operation of the LD detecting part according to the first embodiment of the present invention.

The operation in the first embodiment of the present invention is explained with reference to FIG. 4 to FIG. 6.

As in the conventional example, a phase comparator 71, the loop filter 72, and a voltage controlled oscillator 73 operate together under the control of the controlling part to self-tune at their start and output a local-frequency signal with a prescribed frequency appropriate for a value of a control signal given by the controlling part and a control voltage given via the phase-locked loop.

Meanwhile, one of the inputs of the comparator 92-1 and one of the inputs of the comparator 92-2 in the LD detecting part 91 are given the reference voltages Vref1, Vref2 respectively, which are the control voltages to be given to the voltage controlled oscillator 73 so that, for example, an oscillation frequency of the voltage controlled oscillator 73 respectively becomes a minimum frequency and a maximum frequency of a partial band including the prescribed frequency.

The comparator 92-1 outputs a binary signal whose logical value becomes '1' only when the control voltage actually given to the voltage controlled oscillator 73 is lower than the reference voltage Vref1 (FIG. 6(1)), and the comparator 92-2 outputs a binary signal whose logical value becomes '1' only when the control voltage is higher than the reference voltage Vref2 (FIG. 6(2)).

The OR gate 93 takes a logical add of these binary signals to output a binary signal (hereinafter called a 'limit signal') whose logical value becomes '0' only when the control voltage is higher than or equal to the reference voltage Vref1 and lower than or equal to the reference voltage Vref2 (FIG. 6 (3)).

Meanwhile, the controlling part maintains a value of the control signal at a rough tuning value specified in advance and tolerates an indirect frequency synthesis performed via the phase-locked loop only when the logical value of the limit signal is '0' (FIG. 5 (1)).

However, when the logical value of the limit signal becomes '1' (FIG. 5 (2)), the retrial of the self-tuning is immediately started under the control of the controlling part (FIG. 5 (3)).

Note that an operation of the controlling part and operations of the phase comparator 71, the loop filter 72, and the voltage controlled oscillator 73 which operate together under the control of the controlling part in this self-tuning process (FIG. 5(4)) are basically the same as those at their start described above, and therefore the explanations thereof are omitted.

Therefore, even when the frequency of the local-frequency signal generated by the voltage controlled oscillator 73 is maintained at a prescribed value under a feedback control performed via the phase-locked loop, the self-tuning is retried automatically regardless of variances in environment conditions including power-supply voltage and temperature and other causes as long as the control voltage actually given to the voltage controlled oscillator 73 is lower than the reference voltage Vref1 or higher than the reference voltage Vref2.

In this embodiment, as described above, when there is a high possibility that the phase-locked loop gets into the state in which the lock state cannot be maintained, a lock-up (it means that the phase-locked loop gets into the lock state and an oscillation frequency of the voltage controlled oscillator 73 converges to a prescribed frequency) is realized independently in an early stage.

Therefore, in equipment with a frequency synthesizer according to the present embodiment mounted therein, a stable performance can be maintained compared with the conventional example where no retrial of such self-tuning is conducted.

Figure 7:
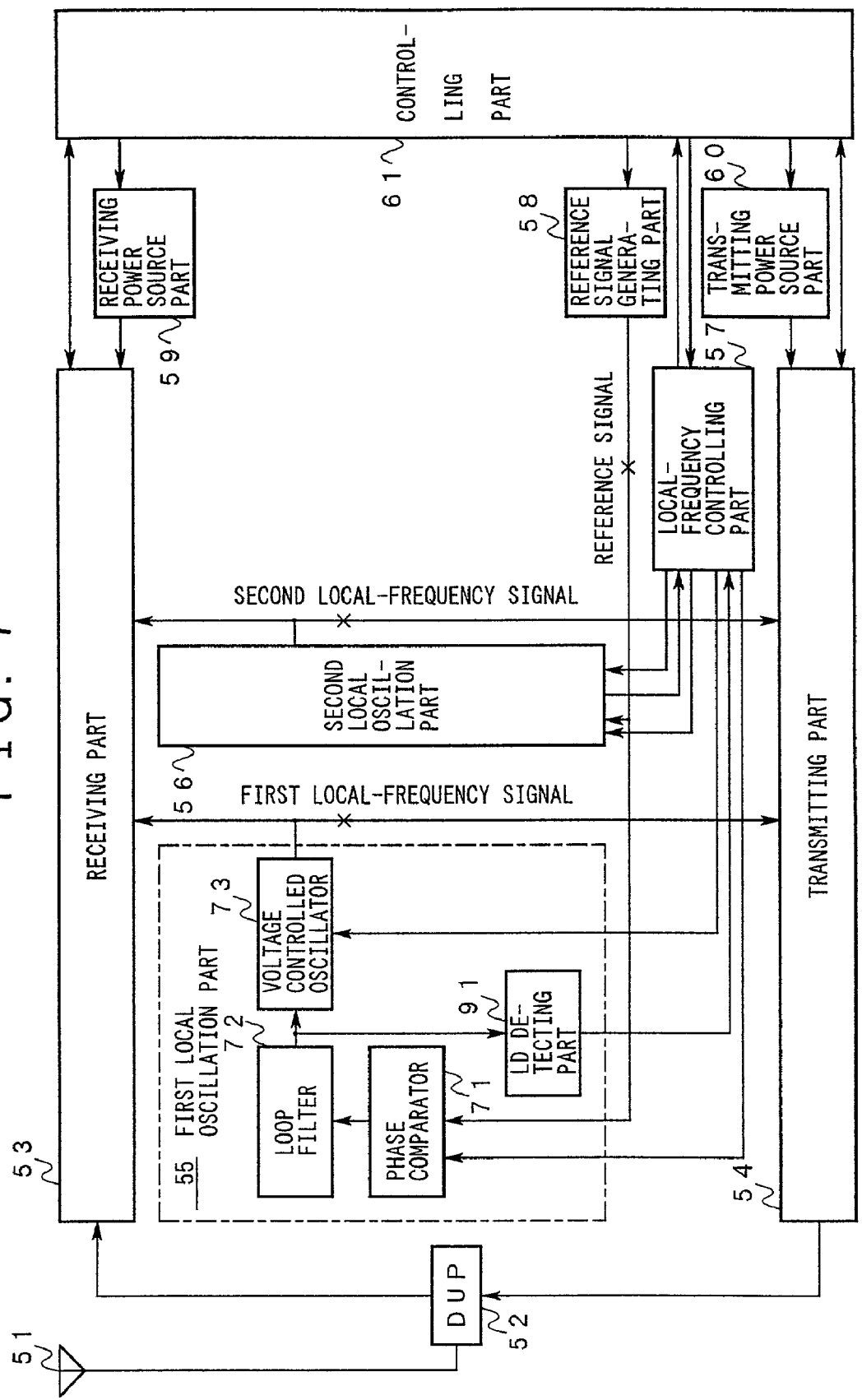
FIG. 7 is a diagram showing a second and a third embodiment of the present invention.

FIG. 7 is a diagram showing a second and a third embodiment of the present invention.

In the drawing, the same symbols and numerals are used to designate the same components as those in FIG. 4 and the explanation thereof is omitted here.

This embodiment is composed of the following components:
an antenna 51;
an antenna duplexer (DUP) 52 with an antenna terminal thereof connected to a feeding point of the antenna 51;
a receiving part 53 with an input thereof connected to a reception output of the antenna duplexer 52;
a transmitting part 54 with an output thereof connected to a transmission input of the antenna duplexer 52;
a first local oscillation part 55 having an output thereof connected to first local frequency inputs of the receiving part 53 and the transmitting part 54 and having basically the same structure as that of the frequency synthesizer shown in FIG. 4;
a second local oscillation part 56 having an output thereof connected to second local frequency inputs of the receiving part 53 and the transmitting part 54;
a local-frequency controlling part 57, which has the same function as that in the first embodiment as far as the cooperation with the first local oscillation part 55 is concerned, for controlling an operation of the second local oscillation part 56;
a reference signal generating part 58 for giving the reference signal to reference signal inputs of the first local oscillation part 55 and the second local oscillation part 56;
a receiving power source part 59 with an output thereof connected to a power source terminal of the receiving part 53;
a transmitting power source part 60 with an output thereof connected to a power source terminal of the transmitting part 54; and
a controlling part 61 having input/output ports connected to respective input/output terminals of the receiving part 53, the transmitting part 54, and the local-frequency controlling part 57, and having output ports directly connected to respective control inputs of the reference signal generating part 58, the receiving power source part 59, and the transmitting power source part 60.

Figure 8:
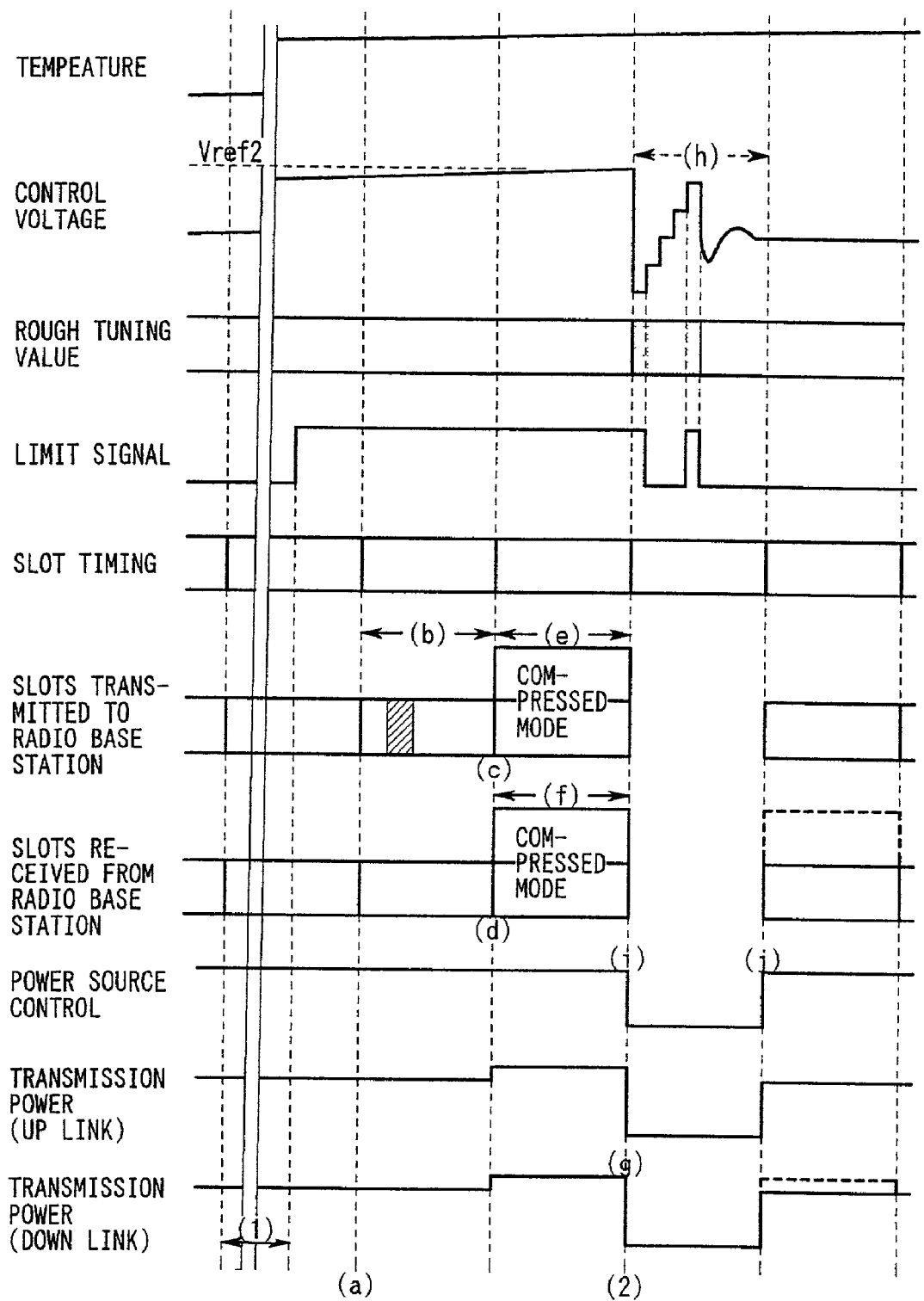
FIG. 8 is a time chart showing an operation in the second embodiment of the present invention.

FIG. 8 is a time chart showing an operation in the second embodiment according to the present invention.

The operation in the second embodiment according to the present invention is explained below with reference to FIG. 7 to FIG. 9 and FIG. 4.

A basic operation of each part is explained first.

The controlling part 61 executes programs accumulated in advance in a memory, which is not shown, to control processing relating to channel control and man-machine interface, and initializes, at the start, the reference signal generating part 58, the receiving power source part 59, and the transmitting power source part 69 together with the local-frequency controlling part 57.

The reference signal generating part 58 constantly generates a reference signal with a frequency designated by the controlling part 61 at the time of the initialization and supplies the reference signal to the first local oscillation part 55 and the second local oscillation part 56.

The local-frequency controlling part 57 basically processes in a similar manner to the controlling part in the first embodiment as far as the cooperation between the first local oscillation part 55 and the second local oscillation part 56 is concerned and realizes the self-tuning of the first local oscillation part 55 and the second local oscillation part 56.

Note that operations performed, for example, in this self-tuning process in the phase comparator 71, the loop filter 72, and the voltage controlling part 73 included in the first local oscillation part 55 are the same as described above, and therefore the explanations thereof are omitted here.

The controlling part 61 operates together with the local-frequency controlling part 57 based on the procedure for initialization and the procedure for channel control which is determined in advance to appropriately set or update frequencies of the first local-frequency signal and the second local-frequency signal which are to be generated by the first local oscillation part 55 and the second local oscillation part 56 respectively.

The receiving part 53 demodulates a reception wave, which reaches the antenna 51 via a predetermined radio channel from a radio base station and is given via the antenna duplexer 52, according to the first local-frequency signal and the second local-frequency signal based on a double superheterodyne system to generate a demodulation signal and gives the demodulation signal to the controlling part 61.

The controlling part 61 generates a synchronization signal by synchronizing with the demodulation signal and gives the synchronization signal to the receiving power source part 59 and the transmitting power source part 60 during periods in which the receiving part 53 and the transmitting part 54 are to operate respectively based on the procedure for channel control.

Figure 10:
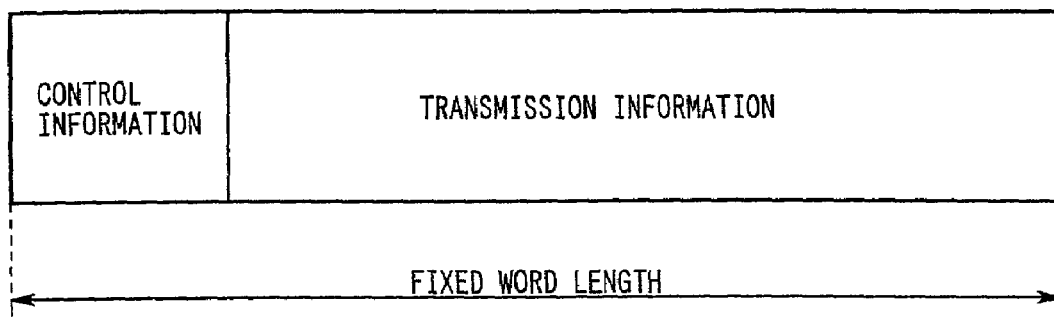
FIG. 10 is a chart showing a slot format.

Incidentally, the above demodulation signal is supposed to be given as an array of a slot which has a fixed word length and consists of a predetermined 'control information' field and a 'transmission information' field where divided transmission information is arranged as shown in FIG. 10.

Furthermore, based on the procedure for channel control, the controlling part 61 discriminates the control information and the transmission information which are included in the array of the slot given as the demodulation signal.

In this process of channel control, the controlling part 61 appropriately gives to the transmitting part 54 the control information to be transmitted to the radio base station based on the procedure for channel control and the transmission information to be transmitted similarly as a speech signal and so on.

The transmitting part 54 appropriately performs frequency conversion according to the first local-frequency signal and the second local-frequency signal to generate a transmission wave modulated by the control information and the transmission information and transmits the transmission wave to the radio base station via the antenna duplexer 52 and the antenna 51.

Meanwhile, in the LD detecting part 91, the reference voltage Vref1 given to the comparator 92-1 is set in advance at a value large enough to secure a 'previous transmitting period', which is explained later, under the condition of a maximum change ratio at which the control voltage given to the voltage controlled oscillator 72 is changeable in a time sequential order. Similarly, the reference voltage Vref2 given to the comparator 92-2 is also set in advance at a value small enough to secure the 'previous transmitting period' under the condition of a minimum change ratio at which the control voltage is changeable in a time sequential order.

Note that the 'previous transmitting period' is supposed to be defined as a value of an integral multiple of the length of the slot in order to simplify the explanation below.

The local-frequency controlling part 57 maintains a value of the control signal at the rough tuning value which is specified in advance and tolerates the indirect frequency synthesis which is performed via the phase-locked loop (FIG. 8 (1)), as long as a logical value of the limit signal which is outputted by the LD detecting part 91 in a similar manner to that in the first embodiment is '0'.

However, when the logical value of the limit signal becomes '1', the local-frequency controlling part 57 gives to the controlling part 61 a 'limit detection notice' indicating to that effect (FIG. 8(a)).

When the controlling part 61 discriminates this 'limit detection notice', it adds a notice (shown by a half-tone dot meshing in FIG. 8) indicating the following items to a predetermined field of a slot which is to be suceedingly given to the transmitting part 54 and transmitted to the radio base station (hereinafter called a 'notification slot'):

that a slot given further later (hereinafter called an 'upstream compressed slot') is transmitted in a compress mode described later; and that a slot (hereinafter called a 'downstream compressed slot') to be received in parallel to the slot above is transmitted in the compress mode by the radio base station.

When the radio base station receives the 'notification slot' including this notice (FIG. 8(b)), it discriminates the following items and makes a predetermined preparation appropriate for these items:

that a predetermined number (supposed to be '1' to simplify the explanation here) of slot(s) which is(are) received after the 'notification slot' correspond(s) to the 'upstream compressed slot(s)'; and that the 'downstream compressed slot' is to be transmitted to a terminal shown in FIG. 7 in parallel to this 'upstream compressed slot'.

Incidentally, the above preparatory processing is performed in a suitable manner for a structure of hardware mounted in the radio base station, a system of an applied channel control, and others, however, when the present invention is not applied to this radio base station, it can be realized according to various known technology, and therefore the explanation thereof is omitted here.

Furthermore, the controlling part 61 processes the following:

to arrange, in all or a part of the fields forming the above-mentioned 'upstream compressed slot' which is given to the transmitting part 54 further later, information having information content twice as large as that to be arranged in corresponding fields of, for example, two 'normal slots' which do not correspond to the 'upstream compressed slot';

to give to the transmitting part 54 a 'compress-transmission demand' indicating that the 'upstream compressed slot' should be transmitted in the 'compress mode' (FIG. 8(c)); and to give to the receiving part 53 a 'compress-reception demand' indicating that the slot received from the radio base station in parallel to the 'upstream compressed slot' should be demodulated as the 'downstream compressed slot' (FIG. 8(d)).

When the transmitting part 54 is given the 'compress-transmission demand', it transmits the 'upstream compressed slot' in the 'compress mode' (FIG. 8(e)).

When the receiving part 53 is given the 'compress-reception demand', it demodulates the 'downstream compressed slot' as a slot received in the 'compress mode' (FIG. 8(*f*)) to give the information included in the slot to the controlling part 61.

Incidentally, transmitting power of the corresponding slot in the process of the transmission in the 'compress mode' is supposed to be set at a value larger than transmitting power of the above normal slots.

The description of a radio transmission scheme applied which realizes transmission/reception in the 'compress mode' is omitted here since it is not the characteristics of the present invention and it can be achieved by using various known technologies.

When the controlling part 61 discriminates an instant at which the transmission of the 'upstream compressed slot' is completed under the aforementioned synchronization operation, it gives a 'lock-up request' indicating the discrimination to the local-frequency controlling part 57, the receiving power source part 59, and the transmitting power source part 60 (FIG. 8(*g*)).

When the local-frequency controlling part 57 discriminates this 'lock-up request', it operates together with the first local oscillation part 55 to start the retrial of self-tuning (FIG. 8(*h*)) of the first local oscillation part 55 similarly to the first embodiment (FIG. 8(2)).

Incidentally, in a process of the self-tuning, an operation of each part of the local-frequency controlling part 57 and the first local oscillation part 55 which operate together under the control of the local-frequency controlling part 57 is the same as that at the start described above, and therefore, the explanation thereof is omitted here.

When the receiving power source part 59 and the transmitting power source part 60 discriminate the 'lock-up request', they interrupt the supply of power to the receiving part 53 and the transmitting part 4 (FIG. 8(*i*)) respectively.

When the local-frequency controlling part 57 discriminates that the self-tuning is completed, it gives a 'lock-up notification' indicating to that effect to the controlling part 61.

When the controlling part 61 discriminates the 'lock-up notification', it gives a command to the receiving power source part 59 and the transmitting power source part 60 to resume the supply of the power to the receiving part 53 and the transmitting part 54 respectively (FIG. 8(*j*)), and resumes reception/transmission of the succeeding slot under the synchronization operation.

In this way, according to this embodiment, when there is a high possibility that the phase-locked loop which performs the indirect frequency synthesis in the first local oscillation part 55 gets into the limit at which the lock state cannot be maintained because of variances in environment conditions such as a power-supply voltage and temperature, the retrial of the self-tuning of the first local oscillation part 55 is automatically activated and a slot to be given to/from the radio base station during a period in which the generation of the first local-frequency signal is interrupted in the retrial process or during a period in which a frequency of the first local-frequency signal is different from a normal value is transmitted in the 'compress mode' with high accuracy prior to this retrial.

Therefore, in terminal equipment of a mobile communication system to which this embodiment is applied, the integration of the first local oscillation part 55 is achieved without preventing required reduction in power consumption, cost reduction, downsizing, and lightening, and moreover, flexible adaptability to various environments and stable performance are obtained without changing a channel control procedure and a communication protocol.

Figure 9:
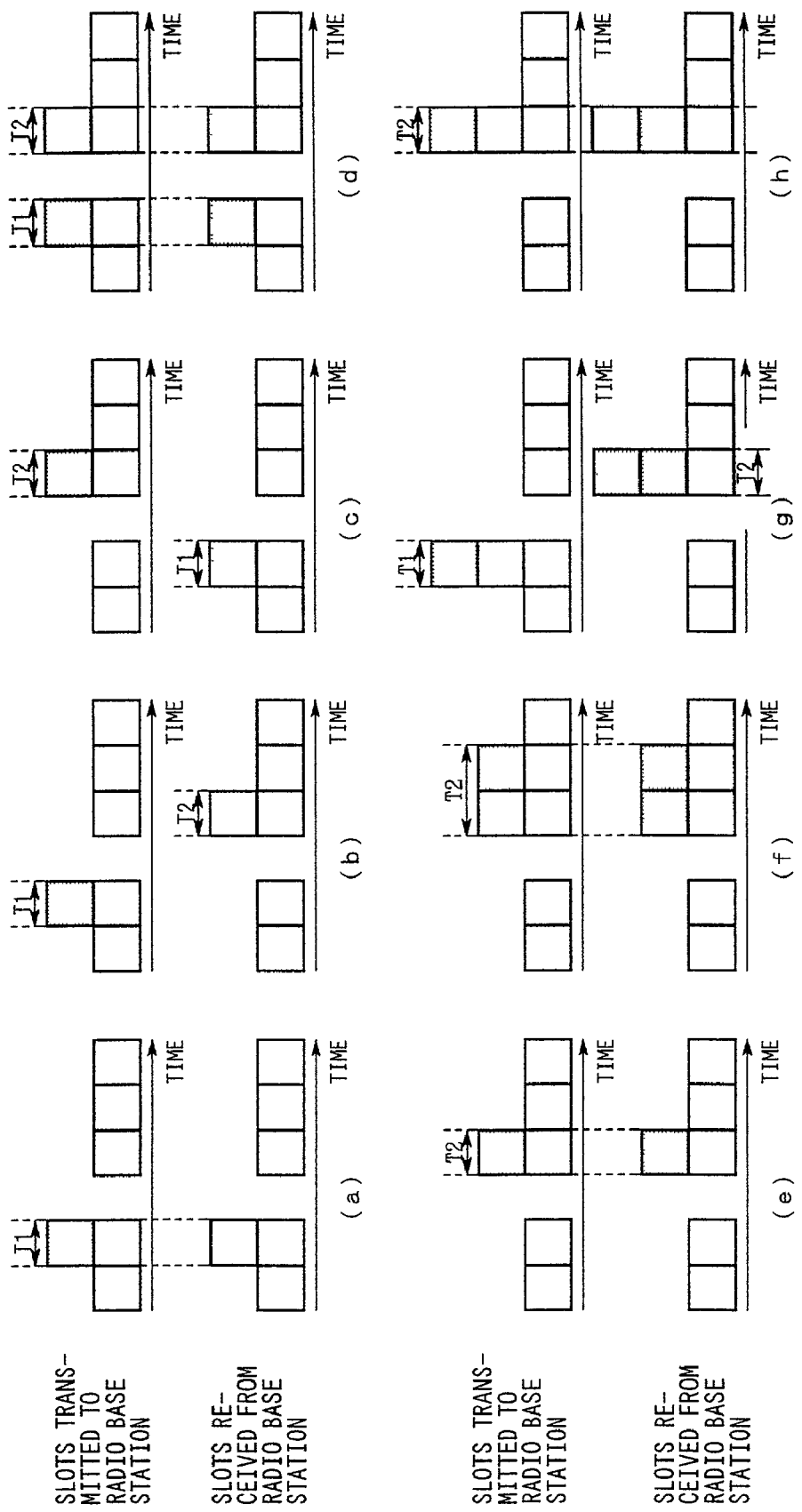
FIG. 9 is an explanatory chart explaining an operation in the second and the third embodiment of the present invention.

Incidentally, as shown in FIG. 9(*a*), the transmission of the 'upstream compressed slot' and the reception of the 'downstream compressed slot' in the 'compress mode' are carried out almost in parallel and after these transmission/reception are completed, the self-tuning of the first local oscillator 55 is retried in this embodiment.

However, the present invention is not limited to this structure and the transmission/reception may be carried out, for example, during periods different from each other on a time base as shown in FIG. 9(*b*), (*c*).

Furthermore, it is not necessarily required that the transmission/reception are completed prior to the self-tuning of the first local oscillation part 55, and they may be continued as shown in FIG. 9(*d*) or carried out collectively after the self-tuning is finished as shown in FIG. 9(*e*), (*f*).

Furthermore, in this embodiment, the transmission in the 'compress mode' is carried out at a transmission rate twice as high as that in a normal mode.

However, this rate may be three times or higher than the transmission rate in a normal mode as shown in FIG. 9(*g*) (*h*).

The third embodiment of the present invention is explained below with reference to FIG. 7 and FIG. 9.

This embodiment is characterized by characteristics of the phase comparator 71, the loop filter 72, and the voltage controlled oscillator 73 included in the first local oscillation part 55 and processing procedure which is performed by the local frequency controlling part 57 and consistent with the characteristics.

In order to avoid a transmission delay which is caused because no slot is transmitted during the period in which the first oscillation part 55 self-tunes, the following inequality must generally hold good for the time t required for the self-tuning, a length T1 (the sum total of slot lengths which are transmitted) of a period in which the transmission in the 'compress mode' is to be carried out prior to this self-tuning, a length T2 (the sum total of slot lengths which are transmitted) of a period in which the transmission in the 'compress mode' is to be carried out after the self-tuning, and the ratio r of the transmission rate at which the transmission in the 'compress mode' is carried out to the normal transmission rate.

$$r(T1+T2) \geq t+T1+T2 \qquad (1)$$

In this embodiment, the ratio r is given in advance as the maximum value and the minimum value of the transmission rate at which radio transmission in the 'compress mode' can be performed via a radio transmission channel which is formed between the radio base station and a mobile station in a mobile communication system to which the present invention is applied.

The lengths T1, T2 of the periods are given in advance as values appropriate for a slot structure of the mobile communication system to which the present invention is applied, the channel control procedure to be performed by the controlling part 61 (including a communication protocol to be applied in the channel control process), and throughputs of the controlling part 61 and the local-frequency controlling part 57.

The phase comparator 71, the loop filter 72, and the voltage controlled oscillator 73 included in the first local oscillation part 55 have characteristics that the required time for the self-tuning is a value at or less than the time $t(\leq (r-1)(T1+T2))$ with which the above formula (1) holds good for the ratio r and the lengths T1, T2 of the periods.

The local-frequency controlling part 57 has a throughput which can process the above at a rate which allows the self-tuning to be completed within the time t or less while operating together with the controlling part 61.

Therefore, according to this embodiment, high transmission quality is maintained within the range of the maximum transmission rate which can be realized in the 'compress mode', the channel control procedure, and the throughput to be processed in the controlling part 61 and the local-frequency controlling part 57 for realizing the self-tuning.

Incidentally, in this embodiment, the first local oscillation part 55 is provided which can complete the self-tuning at a rate high enough to avoid an occurrence of a transmission delay caused by the retrial of the self-tuning under the condition of the ratio r and the lengths T1, T2 of the periods which are given in advance.

However, the present invention is not limited to this structure and either one of the following two structures may be applied to similarly maintain high transmission quality.

The ratio r and the time t required for the self-tuning by the first local oscillation part 55 are given in advance and the sum total of the lengths T1, T2 of the periods is set at a value ($\geq t/(r-1)$) with which the above formula (1) holds good for the ratio r and the time t.

The time t and the lengths T1, T2 of the periods are given in advance and the ratio r is set at a value ($\geq 1+t/(T1+T2)$) with which the above formula (1) holds good for the time t and the lengths T1, T2 of the periods.

In the embodiments described above, the present invention is applied to the terminal equipment which transmits/receives a prescribed transmission information via the radio transmission channel formed between it and the radio base station.

However, the present invention is not limited to be applied to such terminal equipment and is also applicable to radio equipment (including the radio base station) and transmission equipment which either transmit or receive as long as it is equipment which converts frequency or detects heterodyne according to the local-frequency signal generated by the first local oscillation part 55.

Moreover, during the period in which the first local oscillation part 55 self-tunes, a retrial of self-tuning of the frequency synthesizer according to the present invention may be performed in parallel in the radio base station to which the present invention is applied.

In the embodiments described above, the 'notification slot' including the notice is transmitted to the radio base station (FIG. 8(*b*)).

However, the present invention is not limited to this structure and any 'notification slot' needs not to be transmitted, for example, when a slot transmitted in one of the 'compress mode' and a 'normal mode' can be received without switching the mode, or can surely be received based on a slot format in the radio base station.

Furthermore, in the embodiments described above, the transmitting power is set at a high value during the period of transmission in the 'compress mode'.

However, the present invention is not limited to this structure and the transmitting power may be maintained at a fixed value when degeneration of transmission quality is tolerated or some compensating technology such as a transmission channel coding system and others which can compensate for the degeneration of transmission quality is applied.

In the embodiments described above, the ratio r is a fixed value.

However, the present invention is not limited to this structure and the transmission rate in the 'compress mode' needs not to be fixed when a transmitting end and a receiving end both can discriminate the ratio r without fail and transmission quality is allowed to be proper and improved, and preferable effects such as effective use of resources can be obtained by changing the ratio r.

In the embodiments described above, all the transmission information is classified and transmitted in a unit of a slot whose length on a time base is fixed, whether or not the 'compress mode' is applied.

However, the present invention is not limited to this structure and each slot length and word length may be different from each other.

In the embodiments described above, the transmission/reception in the 'compress mode' are started and the retrial of the self-tuning is also started without confirming whether the 'notification slot' is received by the radio base station or not.

However, the present invention is not limited to this structure and the response indicating that the 'notification slot' is received may be transmitted by the radio base station and the reception of the response may be confirmed by the receiving part 53, the controlling part 61, and the local-frequency controlling part 57 operating together prior to the start of the transmission/reception in the 'compress mode' or the start of the retrial of the self-tuning, as long as a prescribed time for the transmission/reception in the 'compress mode' and others are secured.

In the embodiments described above, the first local oscillation part 55 generates the first local-frequency signal by performing the indirect frequency synthesis within the range of the partial band determined according to the capacitance of the capacitors which are grounded via switches 86-1 to 86-4, out of capacitors 84-1 to 84-4 provided in the voltage controlled oscillator 73.

However, the present invention is not limited to this structure, and the first local-frequency signal may be generated, for example, by frequency-synthesizing in a similar manner within the range of a partial band determined according to the sum total of a capacitance of a single or a plural capacitor(s) which is (are) grounded via the switches 86-1 to 86-4, out of the capacitors 84-1 to 84-4.

In the embodiments described above, the partial band is set according to the capacitance of the capacitors which are grounded via the switches 86-1 to 86-4, out of the capacitors 84-1 to 84-4.

However, the present invention is not limited to this structure, for example, the voltage controlled oscillator 73 may be provided with any reactive element or any variable reactive element instead of the capacitors 84-1 to 84-4 as long as such an element has a reactance enough to set each partial band within a desired band.

In the embodiments described above, the LD detecting part 91 monitors the instantaneous value of the control voltage given to the voltage controlled oscillator 73 to output the limit signal.

However, the present invention is not limited to this structure and instead of the control voltage, a level and a spurious component of the first local-frequency signal generated by the voltage controlled oscillator 73 or their statistical distribution (fluctuation) may be monitored or an operation status of any circuit forming the voltage controlled oscillator 73 may be monitored, as long as the limit signal indicating with prescribed accuracy the prediction of the limit at which the phase-locked loop cannot maintain the lock-up state is generated.

In the embodiments described above, the present invention is applied to the terminal equipment and the radio base station of the mobile communication system to which a CDMA system is applied.

However, the present invention is not limited to this structure and it may be applied to any transmission system to which a multiple access system other than a TDMA system is applied as long as transmission information is transmitted/received successively and a transmission delay occurrence can be maintained in not a fluctuating manner.

In the embodiments described above, no description is given on whether means for dividing, multiplying, or frequency converting the reference signal and a prescaler for dividing the first local-frequency signal are provided or not.

However, the first local oscillation part 55 may be structured as a circuit of any system as long as it generates the first local-frequency signal while the indirect frequency synthesis is performed.

In the embodiments described above, the oscillation frequency of the voltage controlled oscillator 73 is set and changed based on the following items:
a frequency of the reference signal; and
a value of the control signal (corresponding to the sum total of the capacitance of the capacitors which are grounded via the switches 86-1 to 86-4, out of the capacitors 84-1 to 84-3, and a division ratio given to the phase comparator 71).

However, the present invention is not limited to this structure and, for example, the division ratio included in the value of the control signal may be a constant when the oscillation frequency is to be constant.

The invention is not limited to the above embodiments and various modifications may be made without departing from the spirit and scope of the invention. Any improvement may be made in part or all of the components.

What is claimed is:

1. A communication equipment comprising a transmitting part for transmitting transmission information by using an output signal of a phase lock oscillator which has a phase-locked loop including a reactive element and whose oscillation frequency varies according to an input signal, wherein said phase lock oscillator comprises:
   a limit discriminating section for discriminating an instant preceding an instant which is a limit that said phase-locked loop is capable of maintaining its lock state; and
   a controlling part for starting a processing of varying a reactance of said reactive element at a first instant succeeding said preceding instant, when said preceding instant is detected by said limit discriminating section, in which
   said controlling part controls said transmitting part to transmit said transmission information at a higher transmission rate than a transmission rate applied immediately before said preceding instant, the transmission being performed: during a specified period from an instant at which said preceding instant is detected, to said first instant; or after a predetermined time elapses from said first instant.

2. The communication equipment according to claim 1, wherein
   said controlling part controls said transmitting part to transmit a signal for notifying an opponent communication equipment of a change in transmission rate before a beginning of said transmission at said higher transmission rate.

3. The communication equipment according to claim 2, further comprising
   a response receiving section for receiving a response transmitted from a receiving end which receives a notification transmitted from said transmitting part, the response being transmitted in response to the notification, and wherein
   said controlling part withholds a processing of varying said reactance of said reactive element until an instant at which said response is received.

4. The communication equipment according to claim 1, wherein
   said transmitting part transmits transmission information at a power at a time of said transmission at said higher transmission rate, the power being larger than a power applied at transmission immediately before said preceding instant.

5. The communication equipment according to claim 1, wherein
   said phase lock oscillator has a lock-up time t which is equal to or shorter than a product of:
   a difference between a ratio r of maximum to minimum values of a transmission rate applicable to both or one of transmitting and receiving, and '1'; and
   a length T of a period which is within said specified period and where a transmission rate is set to a value higher than the minimum value.

6. The communication equipment according to claim 1, wherein
   a ratio r of maximum to minimum values of a transmission rate applicable to both or one of transmitting and receiving is set at a value equal to or larger than a sum of '1' and a ratio of a lock-up time t of said phase lock oscillator to a length T of a period which is within said specified period and where a transmission rate is set to a value higher than the minimum value.

7. The communication equipment according to claim 1, wherein
   a length T of a period is set to a value equal to or larger than a ratio of a lock-up time t of said phase lock oscillator to a difference between a ratio r of maximum to minimum values of a transmission rate and '1', the period being a period which is within said specified period and where the transmission rate to be applied to both or one of transmitting and receiving is set at a value higher than the minimum value of the transmission rate.

8. The communication equipment according to claim 1, wherein:
   said transmission information is transmitted/received via a sequence of multiplexed slots; and
   said transmission rate is set individually for each slot.

9. The communication equipment according to claim 1, wherein
   a signal generated by said phase lock oscillator is used as one of a carrier signal for transmission and a local-frequency signal for generation of the carrier signal.

10. A communication equipment comprising a receiving part for receiving a reception signal by using an output signal of a phase lock oscillator which has a phase-locked loop including a reactive element and whose oscillation frequency varies according to an input signal, wherein said phase lock oscillator comprises:
   a limit discriminating section for discriminating an instant preceding an instant which is a limit that said phase-locked loop is capable of maintaining its lock state; and
   a controlling part for starting a processing of varying a reactance of said reactive element at a first instant succeeding said preceding instant, when said preceding instant is detected by said limit discriminating section, in which said controlling part controls said receiving part to perform a receiving processing of said reception signal at a higher transmission rate than a transmission rate applied immediately before said preceding instant, the reception being performed: during a specified period front an instant at which said preceding instant is detected, to said first instant; or after a predetermined time elapses from said first instant.

11. The communication equipment according to claim 10, further comprising a transmitting part for transmitting transmission information by using an output signal of said phase lock oscillator, and wherein said controlling part controls said transmitting part to transmit a signal for notifying an opponent communication equipment of a change in said transmission rate, the transmission being performed during a specified period from an instant at which said preceding instant is detected, to an instant before said first instant.

12. The communication equipment according to claim 10, wherein said phase lock oscillator has a lock-up time t which is equal to or shorter than a product of:

a difference between a ratio r of maximum to minimum values of a transmission rate applicable to both or one of transmitting and receiving, and '1'; and a length T of a period which is within said specified period and where a transmission rate is set to a value higher than the minimum value.

13. The communication equipment according to claim 10, wherein a ratio r of maximum to minimum values of a transmission rate applicable to both or one of transmitting and receiving is set at a value equal to or larger than a sum of '1'and a ratio of a lock-up time t of said phase lock oscillator to a length T of a period which is within said specified period and where a transmission rate is set to a value higher than the minimum value.

14. The communication equipment according to claim 10, wherein a length T of a period is set to a value equal to or larger than a ratio of a lock-up time t of said phase lock oscillator to a difference between a ratio r of maximum to minimum values of a transmission rate and '1', the period being a period which is within said specified period and where the transmission rate to be applied to both or one of transmitting and receiving is set at a value higher than the minimum value of the transmission rate.

15. The communication equipment according to claim 10, wherein:

said transmission information is transmitted/received via a sequence of multiplexed slots; and said transmission rate is set individually for each slot.

16. The communication equipment according to claim 10, wherein a signal generated by said phase lock oscillator is used as one of a carrier signal for transmission and a local-frequency signal for generation of the carrier signal.

17. The communication equipment according to claim 10, wherein a signal generated by said phase lock oscillator is used as a local-frequency signal employed for heterodyne detection performed in a receiving process.

* * * * *